(12) United States Patent
Ravesi et al.

(10) Patent No.: US 11,594,667 B2
(45) Date of Patent: Feb. 28, 2023

(54) PROCESS FOR REALIZING A SYSTEM FOR RECOVERING HEAT, IN PARTICULAR BASED ON THE SEEBECK'S EFFECT, AND CORRESPONDING SYSTEM

(71) Applicant: STMicroelectronics S.r.l., Agrate Brianza (IT)

(72) Inventors: Sebastiano Ravesi, Catania (IT); Giovanni Abagnale, Piacenza (IT)

(73) Assignee: STMicroelectronics S.r.l., Agrate Brianza (IT)

(*) Notice: Subject to any disclaimer, the term of this patent is extended or adjusted under 35 U.S.C. 154(b) by 623 days.

(21) Appl. No.: 16/692,861

(22) Filed: Nov. 22, 2019

(65) Prior Publication Data

US 2020/0161528 A1    May 21, 2020

Related U.S. Application Data

(62) Division of application No. 14/788,743, filed on Jun. 30, 2015, now Pat. No. 10,510,941, which is a
(Continued)

(30) Foreign Application Priority Data

Dec. 28, 2009 (IT) .................. MI2009A002313

(51) Int. Cl.
  *H01L 35/34* (2006.01)
  *H01L 27/16* (2006.01)
(52) U.S. Cl.
  CPC .......... *H01L 35/34* (2013.01); *H01L 27/16* (2013.01); *Y02P 70/50* (2015.11)
(58) Field of Classification Search
  CPC .................. H01L 35/34; H01L 27/16
  See application file for complete search history.

(56) References Cited

U.S. PATENT DOCUMENTS 5,167,723 A   12/1992   Tsukakoshi
5,168,339 A   12/1992   Yokotani et al.
(Continued)

FOREIGN PATENT DOCUMENTS

DE    10004390 A    8/2001
EP    1249878 A1   10/2002
(Continued)

OTHER PUBLICATIONS

Aschcroft and Mermin Fermi Energues, Fermi Temperatures and Fermi Velocities, http://hyperphysics.phy-astr.gsu/hbase/tables/fermi.html, 1, Mar. 2007, pp. 1-3.
(Continued)

*Primary Examiner* — Tae-Sik Kang
(74) *Attorney, Agent, or Firm* — Slater Matsil, LLP

(57) ABSTRACT

In one embodiment, a method includes forming a plurality of thermocouples coupled in series by forming first metal segments comprising a first metal, each of the first metal segments having a L-shape. The method further includes forming a plurality of deep openings to expose a first contact region of each of the first metal segments, and forming a plurality of shallow openings to expose a second contact region of each of the first metal segments. The method further includes forming second metal segments comprising a second metal over the dielectric layer. The second metal is a different type of metal than the first metal. Each of the second metal segments contacts one of the first contact region of the first metal segments through one of the plurality of deep openings and contacts one of the second contact region of the first metal segments through one of the plurality of shallow openings. The plurality of thermocouples is formed within a building component.

26 Claims, 5 Drawing Sheets

Related U.S. Application Data division of application No. 12/975,222, filed on Dec. 21, 2010, now Pat. No. 9,105,811.

(56) References Cited

U.S. PATENT DOCUMENTS

| | | | |
|---|---|---|---|
| 5,430,322 | A | 7/1995 | Koyanagi et al. |
| 6,121,539 | A * | 9/2000 | Johnson ............... H01L 23/38 |
| | | | 136/203 |
| 6,747,572 | B2 | 6/2004 | Bocko et al. |
| 9,105,811 | B2 | 8/2015 | Abagnale et al. |
| 2005/0115601 | A1 | 6/2005 | Olsen et al. |
| 2007/0125413 | A1 | 6/2007 | Olsen et al. |
| 2010/0101622 | A1 | 4/2010 | Sasaki et al. |
| 2010/0186794 | A1 | 7/2010 | Chen et al. |
| 2011/0146741 | A1 * | 6/2011 | Hida ..................... H01L 35/08 |
| | | | 136/201 |
| 2015/0303367 | A1 | 10/2015 | Abagnale et al. |

FOREIGN PATENT DOCUMENTS

| | | |
|---|---|---|
| EP | 1840980 A1 | 10/2007 |
| JP | 2006086510 A | 3/2006 |
| WO | 8907836 A1 | 8/1989 |
| WO | 2007141890 A1 | 12/2007 |
| WO | 2009011430 A1 | 1/2009 |
| WO | 2009030236 A1 | 3/2009 |
| WO | 2010065082 A1 | 6/2010 |

OTHER PUBLICATIONS

"Fermi Energies, Fermi Temperatures, and Fermi Velocities," Fermi Energies, Solid Properties, http://hyperphysics.phy-astr.gsu.edu/hbase/tables/fermi.html, 3 pages. printed May 29, 2014.

Reddy, S et al., "Thermal Conductivity of Natural Fiber, Glass Fiber & CNTs Reinforced Expoxy Composites," International Journal of Current Engineering and Technology, vol. 6, No. 4, E-ISSN 2277-4106, http://inpressco.com/category/ijcet, 3 pages, Aug. 2016.

* cited by examiner

PROCESS FOR REALIZING A SYSTEM FOR RECOVERING HEAT, IN PARTICULAR BASED ON THE SEEBECK'S EFFECT, AND CORRESPONDING SYSTEM

CROSS-REFERENCE TO RELATED APPLICATIONS

This application is a divisional of U.S. Non Provisional Ser. No. 14/788,743 filed on Jun. 30, 2015, which is a divisional of U.S. Non Provisional Ser. No. 12/975,222 filed on Dec. 21, 2010, which claims the benefit of Italian Application No. MI2009A002313 filed on Dec. 28, 2009, which application is hereby incorporated herein by reference.

TECHNICAL FIELD

An embodiment relates to a process for realizing a system for recovering heat.

An embodiment also relates to a system for recovering heat.

An embodiment particularly, but not exclusively, relates to a process for realizing a system for recovering heat, in particular based on the Seebeck's effect and comprising a plurality of thermocouples and the following description is made with reference to this field of application for convenience of explanation only.

BACKGROUND

As it is well known, in the continuous research aimed to maximize the utilization of the electric power which is employed for normal human activities, the recovery of the heat, being produced as a secondary effect in these activities, is one of the keypoints to optimize the energy rendering and also to reduce the total power consumption in any kind of apparatus.

For this reason, several systems have been studied over the years, usually indicated as "scavengers", which are able to recover the heat generated by an operation performed by using electric energy.

Many known solutions, unfortunately, have a low efficiency value (for a maximum of around 10%), calculated as the amount of recovered heat, taking into account of the overall quantity of available heat.

It has been observed that solutions based on the Seebeck's effect are typically more efficient in term of energy balance because they allow a one-way and direct transformation of the heat into electric power.

The Seebeck's effect is in fact a thermoelectric effect providing a direct conversion of temperature differences into an electric voltage.

In particular, since metals respond differently to temperature, it is possible to create a current loop, when a closed loop is formed of two metals being joined and having opposite ends in two places with a temperature difference. In fact, a voltage is created in the presence of a temperature difference between two different metals or semiconductors, a continuous current then flowing in the conductors if they form a complete loop.

The Seebeck's effect is commonly used in a device called thermocouple (because it is made from a coupling or junction of materials, usually metals) to directly measure a temperature difference or to measure an absolute temperature by setting one of its ends to a known temperature.

A thermocouple based on the Seebeck's effect may be also used, working in an opposite way, for the production of electrical power by converting a gradient of temperatures into electricity, thus being an efficient system for recovering heat, as above indicated.

Also efficient systems based on the Seebeck's effect are,—however, bound by the underlying physical principle which is linked to the physical-chemical nature of the materials being used to form the thermocouple, and also depends on the difference of temperatures between the thermocouple ends, such that the problem of a low efficiency may also arise in these systems.

SUMMARY

An embodiment is a process for realizing a system for recovering heat based on the Seebeck's effect having structural and functional characteristics which allow optimizing and to increasing their efficiency by maximizing the use of a thermal gradient and, at a same time, reducing the resistance of the system so obtained, which has thus an improved rendering, in this way overcoming the limits which still affect systems realized according to the prior art.

An embodiment maximizes the areas capable of picking up the available heat of a system for recovering heat by using a serial connection of a high number of devices for recovering heat, in particular thermocouples. It may be observed that an embodiment of a system comprising the serially connected thermocouples may also have a reduced transmission of heat in the corresponding junctions.

An embodiment of a process for realizing a system for recovering heat comprises the steps of: formation on a substrate of a plurality of L-shaped down metal structures; deposition of a dielectric layer on said substrate and said plurality of L-shaped down metal structures by using a screen printing approach; definition and opening in said dielectric layer of upper contacts and lower contacts of said L-shaped down metal structures; and formation of a plurality of L-shaped up metal structures being connected to said plurality of L-shaped down metal structure in correspondence of said upper and lower contacts so as to form a plurality of serially connected thermocouples, each comprising at least one L-shaped down metal structure and at least one L-shaped up metal structure, being made of different metal materials and interconnected at a junction, said serially connected thermocouples thus realizing said system for recovering heat.

More in particular, an embodiment may comprise the following supplemental and optional features, taken alone or in combination when needed.

According to an embodiment, said step of deposition of a dielectric layer by using a screen printing approach is performed on a substrate, being made of on a material chosen between silicon, ceramics, glass, plastic, and the like.

According to an embodiment, said step of deposition of said dielectric layer comprises a step of depositing dielectric paste formed by means of materials having a low electrical and thermal conductivity.

In particular, yet according to an embodiment, said step of deposition of said dielectric layer comprises a step of depositing a dielectric layer having resistance value greater than approximately 10 GΩ/sq/mil, for example between approximately 10 and 20 GΩ/sq/mil and a thermal coefficient smaller that approximately 1.25 W/(mK), for example between approximately 1.04 W/(mK) and 1.25 W/(mK).

Further according to an embodiment, said step of deposition of said dielectric layer comprises a step of depositing of approximately 50-100 μm, for example approximately 100 μm.

Moreover, according to an embodiment, said step of formation of said L-shaped down metal structures comprises a step of deposition and definition of a first metal layer on said substrate.

According to an embodiment, said step of formation of said L-shaped up metal structures further comprises a step of deposition and definition of a second metal layer, being different from said first metal layer.

Moreover, according to an embodiment, said step of deposition and definition of said first metal layer on said substrate comprises the steps of: patterning of said first metal layer by using a first photoresist layer and a photolithographic technique to realize first and second islands of said first metal layer on said substrate being suitably separated from one another; deposition of a second photoresist layer and subsequent patterning by using a photolithographic technique, said second photoresist layer covering only partially said first and second islands and an entire portion of said substrate being left exposed between such islands; and removal of said second photoresist layer with the formation of said first and a second down metal structure on said substrate, being L-shaped and separate by a gap in correspondence with said portion of said substrate being left exposed between said first and second islands.

According to another embodiment, said step of definition and opening in said dielectric layer of upper contacts and lower contacts comprises the steps of: deposition of a third photoresist layer on said dielectric layer, patterning of said third photoresist layer, defining therein a plurality of openings in correspondence of upper ends of said L-shaped down metal structures; etching and removal of said third photoresist layer, thus defining said upper contacts; deposition of a fourth photoresist layer, also inside said upper contacts; patterning of said fourth photoresist layer defining a further plurality of openings in correspondence of lower ends of said L-shaped down metal structures; and etching and removal of said fourth photoresist layer, thus defining said lower contacts.

In particular, according to an embodiment, said step of etching and removal of said fourth photoresist layer also defines first and second internal dielectric portions and first and second external dielectric portions of said dielectric layer, said first internal dielectric portion being positioned on a first down metal structure and in contact with a first L-shaped up metal structure, said first external dielectric portion being positioned between said first L-shaped up metal structure and said substrate and in contact with said first down metal structure as well as to a second down metal structure, said second internal dielectric portion being positioned on said second down metal structure and in contact with said first L-shaped up metal structure as well with a second L-shaped up metal structure, and said second external dielectric portion being positioned between said second L-shaped up metal structure and said substrate and in contact with said second down metal structure.

According to yet another embodiment, said step of formation of said L-shaped up metal structures comprises the steps of deposition of said second metal layer on said dielectric layer and within said upper and lower contacts; patterning of said second metal layer by using a fifth photoresist layer and a photolithographic technique; etching and removal of said fifth photoresist layer, thus defining said L-shaped up metal structures, being connected to said L-shaped down metal structures.

According to an embodiment, said step of formation of said L-shaped up metal structures forms said L-shaped up metal structures in such a way that a lower end of a first L-shaped up metal structure is connected to a corresponding lower end of a first down metal structure and an upper end of said first L-shaped up metal structure is connected to an upper end of a second down metal structure, in turn having a lower end connected to a lower end of a second L-shaped up metal structure.

In particular, according to an embodiment, said step of formation of said L-shaped down metal structures comprises a step of deposition of aluminum as said first metal layer.

Moreover, according to an embodiment, said step of formation of said L-shaped up metal structures comprises a step of deposition of gold as said second metal layer.

An embodiment also includes a system for recovering heat of the type comprising a plurality of thermocouples, each comprising an L-shaped down metal structure and an L-shaped up metal structure being interconnected in correspondence of a first junction, wherein said thermocouples are realized on a substrate by using a first and a second metal and connected in a serial mode covering a wide area of said substrate in a serpentine-like geometry by using an embodiment of a process as previously described.

According to an embodiment, said substrate is made on a material chosen between silicon, ceramics, glass, plastic and the like.

According to an embodiment, said L-shaped down and up metal structures of each of said thermocouples are orthogonal to each other.

According to an embodiment, said L-shaped down and up metal structures of each of said thermocouples are in line with each other.

Furthermore, according to an embodiment, said thermocouples are dimensioned to minimize their contact resistance, the resistivity of the L-shaped down and up metal structures and the thermal conductivity of the thermocouples as a whole.

In particular, according to an embodiment, said L-shaped metal down structure have a length between approximately 200 and BOO μm, for example approximately 600 μm, a width between approximately 100 and 200 μm, for example approximately 150 μm and a thickness between approximately 25 and 50 μm, for example approximately 150 μm, and said L-shaped metal up structure have a length between approximately 50 and 150 μm, for example approximately 100 μm, a width between approximately 50 and 150 μm, for example approximately 100 μm and a thickness between approximately 50 and 100μ/m, for example approximately 100 μm.

According to an embodiment, said L-shaped down metal structures of said thermocouples are made on aluminum.

According to an embodiment, said L-shaped up metal structures of said thermocouples are made on gold.

BRIEF DESCRIPTION OF THE DRAWINGS

Characteristics and advantages of a process and of a system for recovering heat according to the invention will be apparent from the following description of one or more embodiments thereof given by way of indicative and non-limiting example with reference to the annexed drawings.

In such drawings.

DETAILED DESCRIPTION OF ILLUSTRATIVE EMBODIMENTS

With reference to such figures, and in particular to FIGS. from 1A to 1I, in the following lines an embodiment of a process for realizing a system 15 for recovering heat will be described.

It is noted that the process steps being described hereinafter may not be•for a complete manufacturing process of an integrated circuit. An embodiment may be carried out along with the manufacturing techniques of integrated circuits being usually employed in the field, and only those process steps being necessary to comprise an embodiment may be described.

Moreover, figures showing schematic views of integrated circuit portions during the manufacturing may not be drawn to scale, being on the contrary drafted so as to emphasize important features of one or more embodiments.

An embodiment starts from a goal of improving or optimizing the efficiency of a system for recovering heat, in particular based on the Seebeck's effect, by using the available heat energy, and thus by widening the areas being capable of picking up the available heat.

As will be clear from the following the description, an embodiment of a proposed process for realizing a system for recovering heat, in particular based on the Seebeck's effect, may allow overcoming two main difficulties being encountered: a) realizing large contact areas of the metal junctions of an employed thermocouple to obtain a lower-resistance thermal transmission in the junctions themselves to increase the speed at which a temperature difference develops in the thermocouple ends, and thus to obtain a consequent fast reaching of an undesired thermal balance; b) on the contrary, reducing the contact areas of the thermocouple metal junctions would increase their contact resistance with a consequent equally undesired potential loss due to the Joule effect.

As will be clarified by the following description, an embodiment arranges different conventional and innovative techniques for realizing on a wide area a system 15 for recovering heat by producing electrical power based on the Seebeck's effect. According to an embodiment, a serial connection of a high number of single devices 10 for recovering heat, in particular thermocouples, is realized in order to optimize the heat recovering and to reduce, at the same time, the heat transmission in the metal junctions realizing such thermocouples.

Figure 1A:
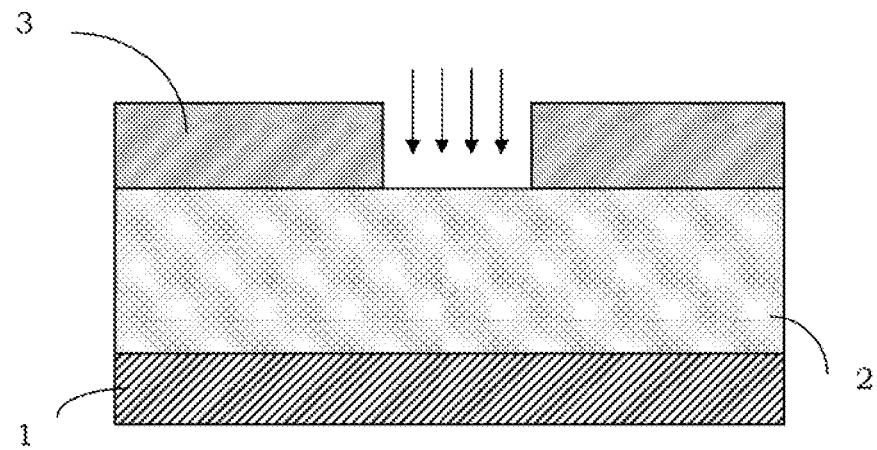
FIGS. 1A-1I schematically show the different steps of a process for realizing a system for recovering heat according to an embodiment.
Figure 1B:
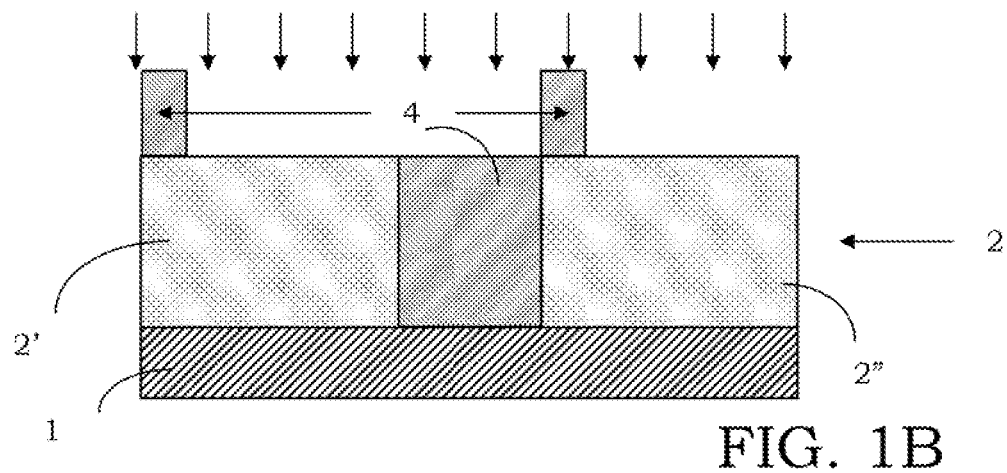
Figure 1C:
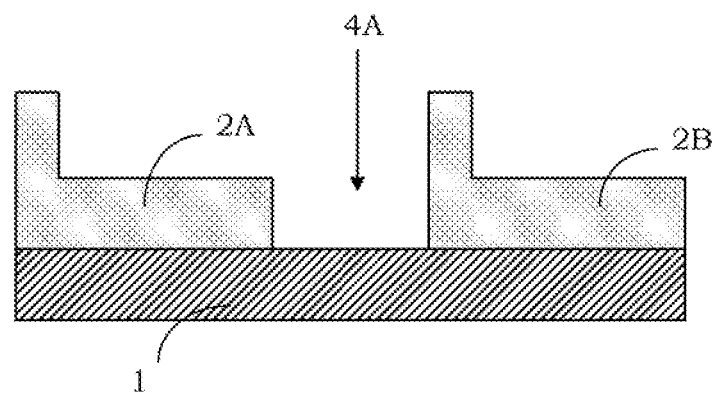
Figure 1D:
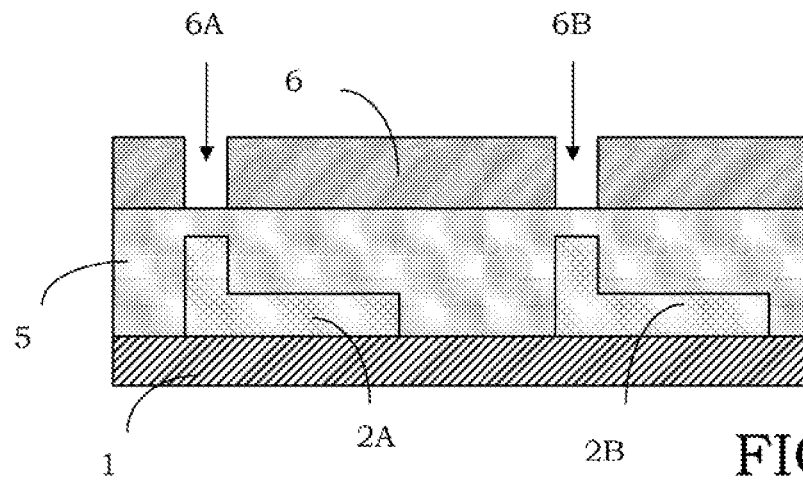
Figure 1E:
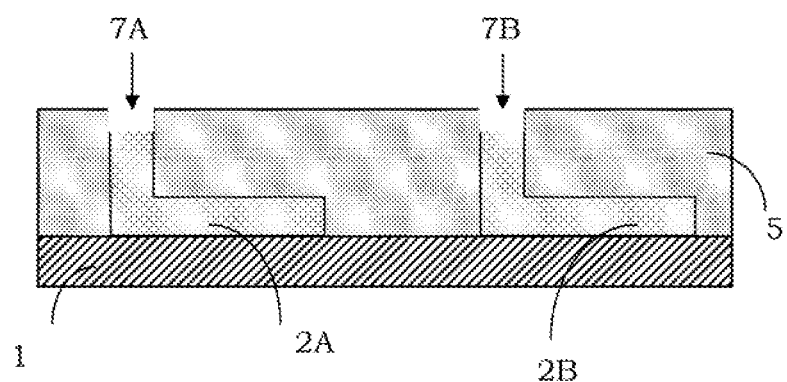
Figure 1F:
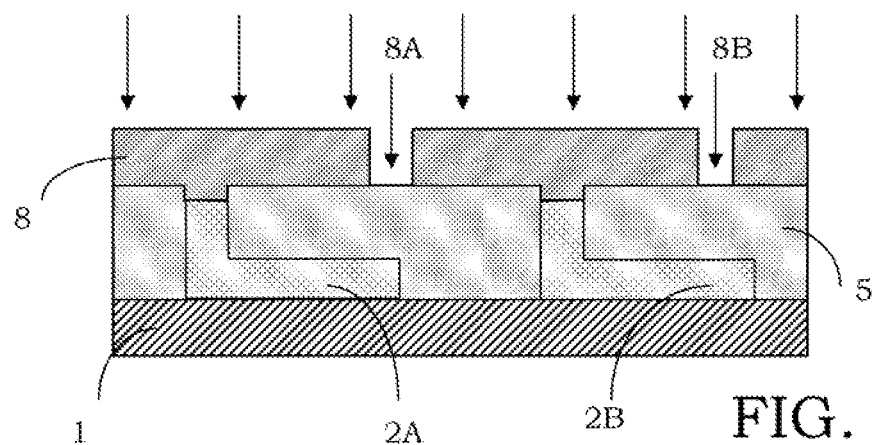
Figure 1G:
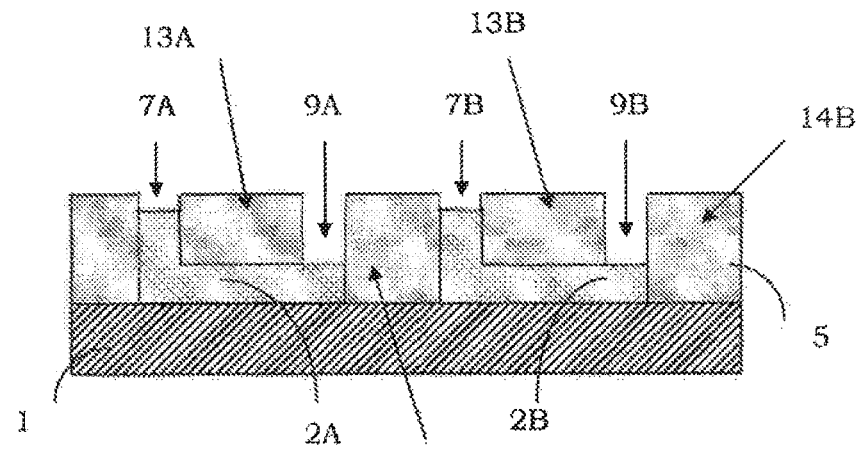
Figure 1H:
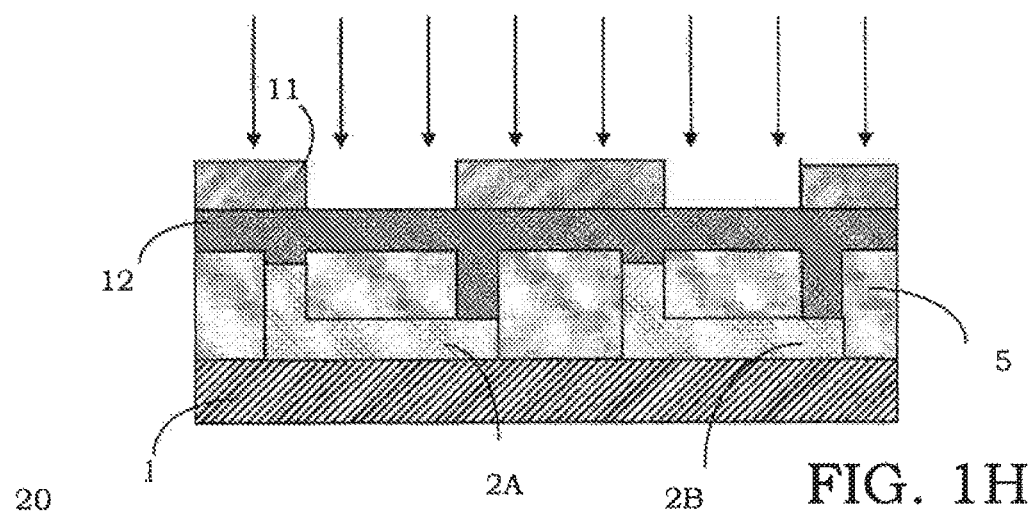
Figure 1I:
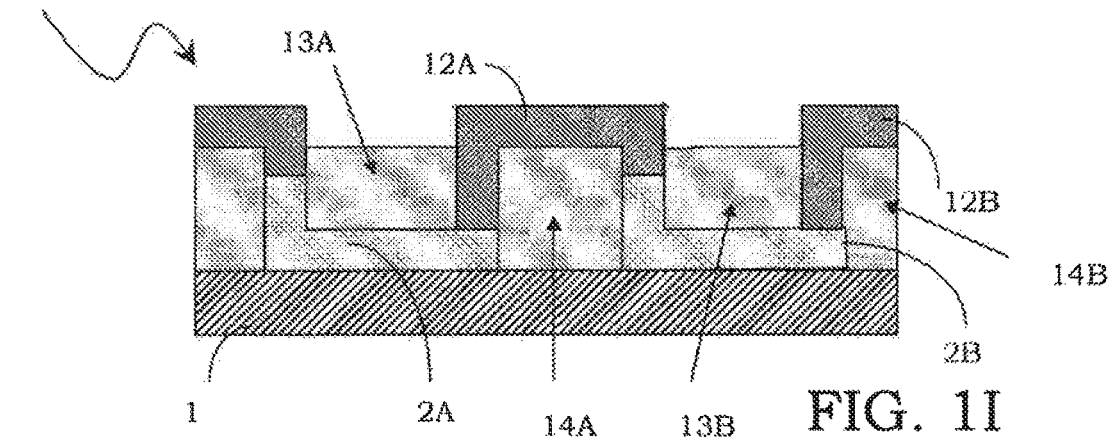

In particular, with reference to the FIGS. 1A to 1I, an embodiment of a process for realizing a system 15 for recovering heat, in particular based on the Seebeck's effect, comprises the steps of: deposition on a substrate 1 of a first metal layer 2, in particular an aluminum layer and subsequent patterning of the first metal layer 2 by using a first photoresist layer 3 and a photolithographic technique, as shown in FIG. 1A; after the photolithography, a first 2' and a second island 2" of the first metal layer 2 are obtained, being suitably separated one another deposition of a second photoresist layer 4 and subsequent patterning by using a photolithographic technique, the second photoresist layer 4 covering only partially the first and second islands, 2' and 2", of the first metal layer 2 and the entire portion of the substrate 1 being left exposed between such islands, as shown in FIG. 1B; removal of the second photoresist layer 4 with the formation of a first 2A and a second down metal structure 2B on the substrate 1, such down metal structures 2A and 2B being L-shaped and separate by a gap 4A in correspondence with the portion of the substrate 1 being left exposed between the islands 2' and 2" of the first metal layer 2, as shown in FIG. 1C; deposition of a dielectric layer 5, in particular a dielectric paste, on the first and second down metal structures, 2A and 2B, as well on the substrate 1 being left exposed outside said structures, for instance in correspondence of the gap 4, by using a screen printing approach, followed by a deposition of a third photoresist layer 6, being thus patterned defining therein a plurality of openings, 6A, 6B in correspondence of upper ends of the L-shaped down metal structures 2A and 2B, as shown in FIG. 1D; etching and removal of the third photoresist layer 6, thus defining a first 7A and a second upper contact 7B of the first and second L-shaped down metal structures, 2A and 2B, respectively, as shown in FIG. 1E; deposition of a fourth photoresist layer 8, also inside the first and second upper contacts, 7A and 7B, being thus patterned in order to define a further plurality of openings, BA, SB in correspondence of lower ends of the L-shaped down metal structures, 2A and 2B, as shown in FIG. 1F; etching and removal of the fourth photoresist layer 8, thus defining a first 9A and a second lower contact 9B of the first and second L-shaped down metal structures 2A and 2B, respectively, as well as a first 13A and a second internal dielectric portion 13B and a first 14A and second external dielectric portion 14B of said dielectric layer 5, as shown in FIG. 1G; deposition of a second metal layer 12, being different from the first metal layer 2, in particular a gold layer, and subsequent patterning of the second metal layer 12 by using a fifth photoresist layer 11 and a photolithographic technique, as shown in FIG. 1H; etching and removal of the fifth photoresist layer 11, thus defining a first 12A and a second L-shaped up metal structure 12B, being connected to the first and second L-shaped down metal structures 2A and 2B in such a way to form respective metal loops, as shown in FIG. 1I.

In an embodiment, the deposition of a dielectric layer 5 by using a screen printing approach may allow one to use any kind of substrate 1, being made of on a material chosen between silicon, ceramics, glass, plastic and the like, for example silicon.

In particular, the screen printing approach is derived from an embodiment of a printing technique that uses a woven mesh to support an ink-blocking stencil forming open areas of mesh that transfer ink as a sharp-edged image onto a substrate. In the electronic circuit manufacturing field, the screen printing comprises a transfer of a paste onto a substrate by extrusion through a patterned screen mesh.

Using a screen printing approach makes the process more versatile than a traditional one since the surface may not have to be printed under pressure, unlike etching or lithography, and it may not have to be planar, offering capabilities that may not be achievable by wet chemical and photolithographic methods.

As a result of the above steps sequence, an embodiment allows obtaining a plurality of devices for recovering heat, in particular thermocouples 10 comprising an L-shaped down metal structure and an. L-shaped up metal structure.

In particular, the lower end of the first L-shaped up metal structure 12A is connect to a corresponding lower end of the first down metal structure 2A, while the upper end of the first L-shaped up metal structure 12A is connected to the upper end of the second down metal structure 2B, in turn having the lower end connected to the lower end of the second L-shaped up metal structure 12B.

Moreover, the first internal dielectric portion 13A is positioned on the first down metal structure 2A and in contact with the first L-shaped up metal structure 12A while the first external dielectric portion 14A is positioned between the first L-shaped up metal structure 12A and the substrate 1 and in contact with the first down metal structure 2A as well as to the second down metal structure 2B.

In a similar way, the second internal dielectric portion 13B is positioned on the second down metal structure 2B and in contact with the first L-shaped up metal structure 12A as well with the second L-shaped up metal structure 12B while the second external dielectric portion 14B is positioned between the second L-shaped up metal structure 12B and the substrate 1 and in contact with the second down metal structure 2B.

It is noted that the relative terms "up", "down", "upper", and "lower" have been used considering the substrate 1 as a base level of the system 15 for recovering heat and the development direction of the multilayer structure above the substrate 1 as increasing from the substrate. The down metal structures 2A and 2B are thus closer to the substrate 1 with respect to the L-shaped up metal structures 12A and 12B.

In its most general terms, an embodiment comprises the following steps: formation on a substrate 1 of a plurality of L-shaped down metal structures 2A, 2B; deposition of a dielectric layer 5 on the substrate 1 and the plurality of L-shaped down metal structures 2A, 2B, by using a screen printing approach; definition and opening in the dielectric layer 5 of upper contacts 7A, 7B and lower contacts 9A, 9B of the L-shaped down metal structures, 2A, 2B formation of a plurality of L-shaped up metal structures 12A, 12B being connected to the plurality of L-shaped down metal structure 2A, 2B in correspondence of the upper and lower contacts, 7A, 7B and 9A, 9B.

In particular, the step of formation of the L-shaped down metal structures 2A and 2B comprises a step of deposition and definition of the first metal layer 2 (also indicated as first metal level).

Moreover, in an embodiment, the step of deposition of a dielectric layer 5 is proceeded by a step of removal of the first resist layer 3.

Also, the dielectric layer 5 may be realized by a dielectric paste formed by means of materials having a low electrical and thermal conductivity, i.e. a high resistance and a low thermal coefficient. In an embodiment, the dielectric layer 5 has resistance value greater than 10 GΩ/sq/mil, for example between 10 and 20 GΩ/sq/mil, and a thermal coefficient smaller than 1.25 W/(mK), for example between 1.04 W/(mK) and 1.25 W/(mK). Suitable materials for the dielectric layer 5 include UV curable pastes, such as the 5018 UV curable paste by DuPont.

Finally, in an embodiment, the step of formation of the L-shaped up metal structures 12A and 12B comprises a step of deposition and definition of the second metal layer 12 (also indicated as second metal level).

In this way, the plurality of devices for recovering heat, in particular thermocouples 10 being thus formed are interconnected in a serial mode in order to realize an embodiment of the system 15 for recovering heat.

Figure 2:
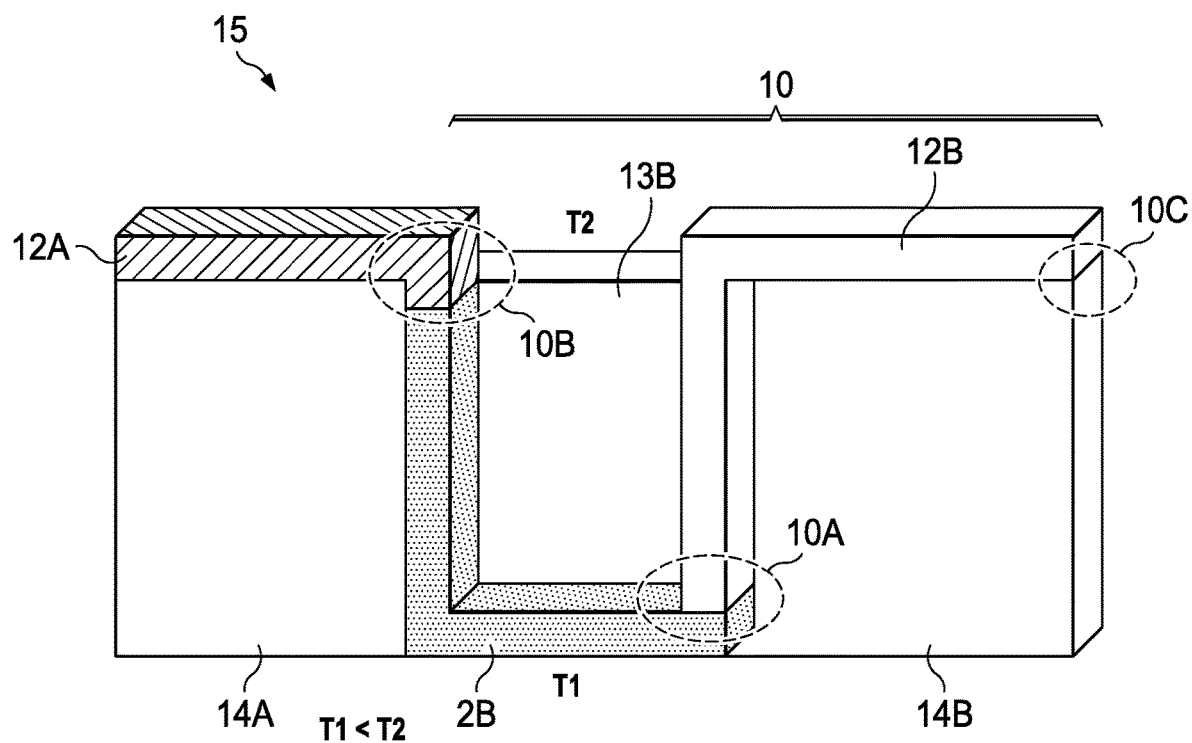
FIG. 2 schematically shows a three-dimensional view of a device for recovering heat, in particular a single thermocouple, of a system according to an embodiment as obtained by an embodiment of the process of FIGS. 1A-1I.

An embodiment of a device for recovering heat, in particular an embodiment of a thermocouple 10 so obtained is shown in FIG. 2 in a 3-D view.

In particular, the thermocouple 10 comprises an L-shaped down metal structure 2 and an L-shaped up metal structure 12, being interconnected in correspondence of a first junction 10A. Moreover, the L-shaped down metal structure 2 is also connected to an L-shaped metal up structure of a previous·thermocouple in the system 15, while the L-shaped up metal structure 12 is also connected to a L-shaped metal down structure of a following thermocouple in the system 15, the relative terms "previous" and "following" having been used with reference to the representation of the FIG. 2 L-shaped down metal structure 2.

The thermocouple 10, during its operate, has the metal structures 2 and 12 at different temperatures, T1 and T2 in FIG. 2, a difference being set between these temperatures (for instance, T1<T2 as indicated in FIG. 2).

According to an embodiment, the system 15 for recovering heat comprises several thermocouples 10 connected in a serial mode. In particular, the system 15 for recovering heat so obtained is able to produce electric power when a difference of temperature is established between its surface and its back side, i.e. between the L-shaped down, metal structures 2 and the L-shaped up metal structures 12 forming their serially connected thermocouples 10.

In an embodiment the serially connected thermocouples10 may be realized in order to cover a·wide area of the substrate 1, so as to improve the efficiency of the system 15 for recovering heat as a whole.

Figure 4A:
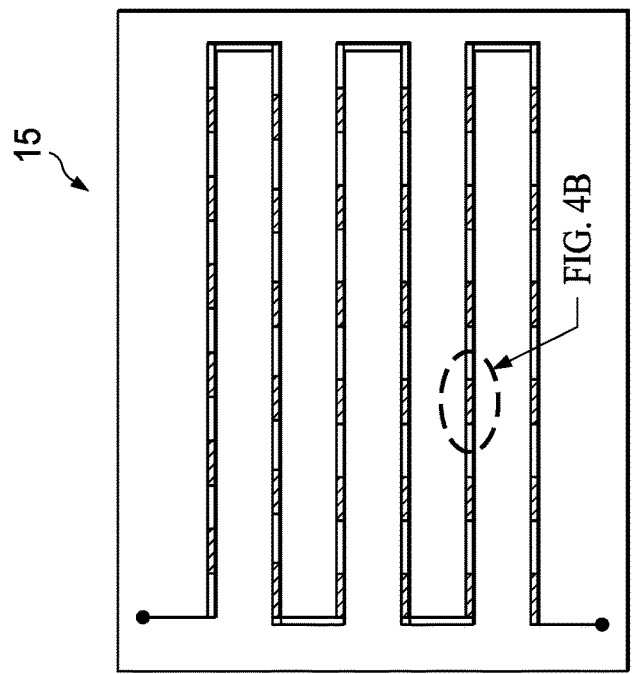
FIGS. 4A and 4B schematically show a schematic layout view and an enlarged view of another embodiment of a system for recovering heat as obtained by an embodiment of the process of FIGS. 1A-1I.
Figure 3A:
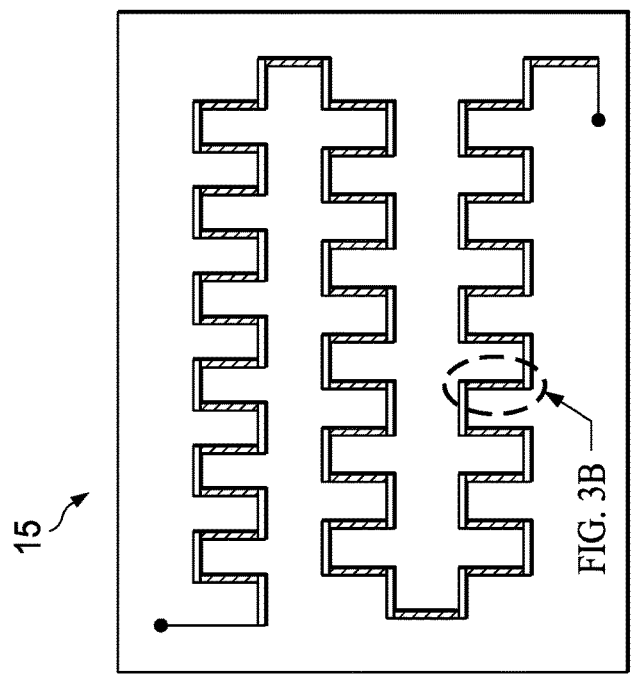
FIGS. 3A and 3B schematically show a schematic layout view and an enlarged view of an embodiment of a system for recovering heat as obtained by an embodiment of the process of FIGS. 1A-1I.

FIGS. 3A and 4A show respective embodiments of serially connected thermocouples 10 of the system 15 for recovering heat.

Figure 3B:
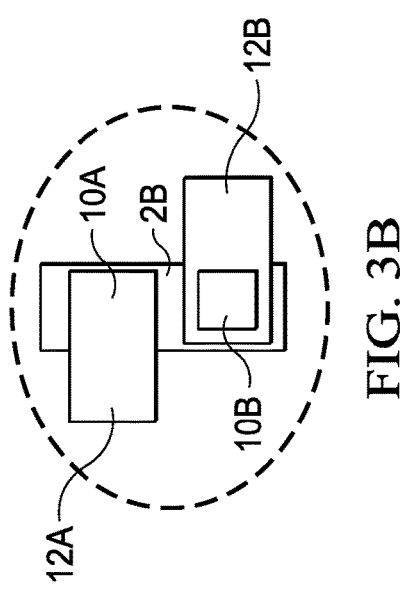

More in detail, as shown in FIG. 3A, according to an embodiment of the system 15 for recovering heat, the serially connected thermocouples 10 are aligned in a serpentine manner, the L-shaped down and up metal structures, 2 and 12, being orthogonal to each other, as shown in the enlarged view of FIG. 3B.

Figure 4B:
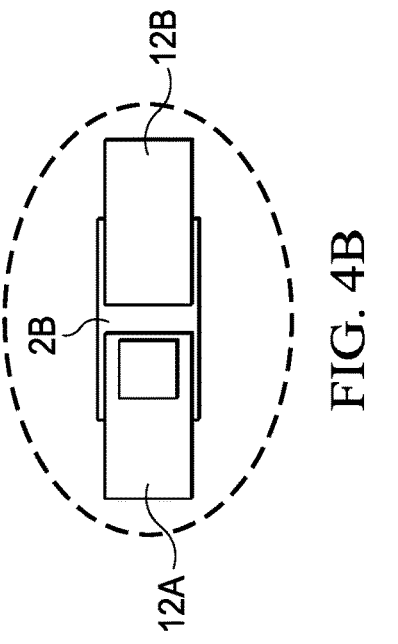

According to another embodiment of the system 15 for recovering heat as shown in FIG. 4A, the serially connected thermocouples 10 are also aligned in a serpentine manner, the L-shaped down and up metal structures, 2 and 12, being, however, in line with each other, as shown in the enlarged view of FIG. 4B.

It is noted that the design of an embodiment of a system for recovering heat may be realized by taking into account the overall resistivity and the different contributions in terms of thermal management.

In particular, a serpentine-like geometry of the system 15 for recovering heat has been used to provide a wide area system and the single thermocouples 10 are dimensioned to minimize their contact resistance as well as the resistivity of the tracks of metal (the first and second metal levels) and the thermal conductivity of the thermocouples themselves. In particular, the L-shaped metal down structures 2 have a length between approximately 200 and 800 µm, for example approximately 600 µm, a width between approximately 100 and 200 µm, for example approximately 150 µm and a thickness between approximately 25 and 50 µm, for example approximately 50 µm, while the L-shaped metal up structures 12 have a length between approximately 50 and 150 µm, for example approximately 100 µm, a width between approximately 50 and 150 µm, for example approximately 100 µm and a thickness between approximately 50 µm and 100 µm, for example approximately 100 µm.

In summary, an embodiment allows obtaining a system for recovering heat comprising a plurality of thermocouples being serially connected and realized on a wide area and being able to convert a difference of temperature in to electrical power, the system 15 for recovering heat being formed on any kind of substrate 1.

In particular, the system 15 for recovering heat according to an embodiment may be realized on substrates made of different materials (as ceramics, glass, plastic, etc.) as well as on a conventional silicon substrate. In this latter case, the traditional techniques of manufacturing microelectronic devices may be used.

Also according to an embodiment, a mix and match of different processes due to the different materials being used may give the possibility of having a large flexibility and versatility of the process, in particular allowing the realize of an embodiment of the system 15 for recovering heat also from unconventional materials, the serpentine-like geometry providing a wide area system.

Moreover, the design of an embodiment of a system for recovering heat is realized taking into account the overall resistivity and the different contributions in terms of thermal management, the single thermocouples being dimensioned so as to minimize their contact resistance as well as the resistivity of the tracks of metal and the thermal conductivity of the thermocouples themselves.

To this end, a dielectric layer may be realized by a dielectric paste formed by means of materials having a low electrical and thermal conductivity.

Finally, in an embodiment, the serially connected thermocouples on a wide area provides for an optimum use of the available heat, the system for recovering heat being thus an efficient system using the heat produced by different sources (being thus at different temperatures), to produce electric power.

The process according to an embodiment may be also used to produce material for the building (e.g., of tiles) to use in environments wherein temperature gradients are present.

An embodiment of such a thermocouple may be disposed on an integrated circuit that is coupled to another integrated circuit, e.g., a processor, to form a system.

Furthermore, an embodiment of such a thermocouple may be included in building materials or components (e.g., title), across which a temperature differential may exist.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

What is claimed is:

1. A method comprising:
    forming a plurality of thermocouples coupled in series by:
        forming first metal segments comprising a first metal, each of the first metal segments having an L-shape;
        forming a plurality of deep openings to expose a first contact region of each of the first metal segments;
        forming a plurality of shallow openings to expose a second contact region of each of the first metal segments; and
        forming second metal segments, comprising a second metal, over the first metal segments, the second metal being a different type of metal than the first metal, wherein each of the second metal segments contacts one of the first contact region of the first metal segments through one of the plurality of deep openings and contacts one of the second contact region of the first metal segments through one of the plurality of shallow openings, wherein the plurality of thermocouples are formed within a building component.

2. The method of claim 1, wherein the building component is a tile.

3. The method of claim 1, wherein the first metal segments comprise a first arm extending along a first direction and a second arm extending along a second direction perpendicular to the first direction, the first arm and the second arm joined together in the L-shape.

4. The method of claim 1, wherein adjacent ones of the first metal segments are formed along a same line.

5. The method of claim 1, wherein forming the first metal segments comprises depositing an aluminum layer, and wherein depositing the second metal segments comprises depositing a gold layer, wherein the first metal comprises aluminum and the second metal comprises gold.

6. The method of claim 1, wherein the first metal segments is separated by one of a plurality of gaps, the method further comprising filling the plurality of gaps by depositing a dielectric layer.

7. The method of claim 1, wherein forming the first metal segments comprises:
    depositing a first metal layer comprising the first metal over a substrate;
    patterning the first metal layer to form a plurality of islands; and
    using a patterning process, forming one of the first metal segments from each of the plurality of islands and leaving a plurality of gaps, wherein a gap separates one of the first metal segments from an adjacent one of the first metal segments.

8. The method of claim 1, wherein forming the second metal segments comprises:
    depositing a second metal layer comprising the second metal over the first metal segments, the second metal layer contacting the first contact region of the first metal segments and the second contact region of the first metal segments.

9. The method of claim 8, further comprising:
    patterning the second metal layer to form the second metal segments so that each of the first metal segments is coupled to an adjacent metal segment only through one of the second metal segments.

10. A method comprising:
    forming a plurality of thermocouples coupled in series in a serpentine geometry by:
        forming first metal segments, comprising a first metal, disposed in a first metal level, the first metal segments comprising a first arm extending along a first direction and a second arm extending along a second direction perpendicular to the first direction;
        forming a plurality of deep openings to expose a portion of the first arm of each of the first metal segments;
        forming a plurality of shallow openings to expose a portion of the second arm of each of the first metal segments; and forming second metal segments, comprising a second metal, over the first metal segments and disposed in a second metal level, the second metal being a different type of metal than the first metal, wherein each of the second metal segments comprise a first portion disposed in one of the plurality of shallow openings and oriented along the second direction, a second portion disposed in one of the plurality of deep openings, and an intermediate portion disposed over dielectric layer between the first portion and the second portion, the first portion contacting the exposed portion of the first arm of one of the first metal segments and the second portion contacting an exposed portion of the second arm of an adjacent one of the first metal segments, wherein the plurality of thermocouples are formed within a building component.

11. The method of claim 10, wherein the building component is a tile.

12. The method of claim 10, wherein adjacent ones of the first metal segments are spaced by one of the intermediate portion of the second metal segments along a third direction perpendicular to the first and the second directions.

13. The method of claim 10, wherein adjacent ones of the first metal segments are formed along a same line.

14. The method of claim 10, wherein the first metal segments are separated by one of a plurality of gaps, the method further comprising filling the plurality of gaps with a dielectric layer.

15. The method of claim 10, wherein forming the first metal segments comprises:
depositing a first metal layer comprising the first metal over a substrate, the first metal layer having a first thickness along the second direction extending perpendicularly away from a major surface of the substrate;
patterning the first metal layer to form a plurality of islands; and
using a patterning process, forming one of the first metal segments from each of the plurality of islands and leaving a plurality of gaps, wherein a gap separates one of the first metal segments from an adjacent one of the first metal segments.

16. The method of claim 10, wherein forming the second metal segments comprises:
depositing a second metal layer comprising the second metal over the dielectric layer, the second metal layer contacting the exposed portion of the first arm of the first metal segments and the exposed portion of the second arm of the first metal segments; and
patterning the second metal layer to form the second metal segments so that each of the first metal segments is coupled to an adjacent metal segment only through one of the second metal segments.

17. The method of claim 10, wherein forming the first metal segments comprises depositing an aluminum layer, and wherein depositing the second metal segments comprises depositing a gold layer, wherein the first metal comprises aluminum and the second metal comprises gold.

18. A method comprising:
depositing a first metal layer comprising a first metal over a substrate, the first metal layer having a first thickness along a first direction extending perpendicularly away from a major surface of the substrate;
patterning the first metal layer to form a first island and a second island;
using a patterning process, forming a first monolithic metal member from the first island and forming a second monolithic metal member from the second island and leaving a gap between the first and the second monolithic metal members;
depositing a dielectric layer to fill the gap;
forming a first deep opening exposing a first end of the first monolithic metal member and a second deep opening exposing a first end of the second monolithic metal member;
forming a first shallow opening shallower than the first deep opening and exposing a second end of the first monolithic metal member and a second shallow opening shallower than the second deep opening and exposing a second end of the second monolithic metal member;
depositing a second metal layer comprising a second metal over the dielectric layer, the second metal being a different metal than the first metal, the second metal layer contacting the first end of the first monolithic metal member through the first deep opening, the first end of the second monolithic metal member through the second deep opening, the second end of the first monolithic metal member through the first shallow opening, and the second end of the second monolithic metal member through the second shallow opening; and
patterning the second metal layer to form a first interconnecting monolithic metal member contacting the first end of the first monolithic metal member and the second end of the second monolithic metal member, wherein the first monolithic metal member, the second monolithic metal member, and the first interconnecting monolithic metal member are formed within a building component.

19. The method of claim 18, wherein the building component is a tile.

20. The method of claim 18, wherein the first monolithic metal member is parallel to the second monolithic metal member.

21. The method of claim 18, wherein the first monolithic metal member and the second monolithic metal member are on a same line.

22. The method of claim 18, wherein patterning the second metal layer further forms a second interconnecting monolithic metal member parallel to the first interconnecting monolithic metal member, the second interconnecting monolithic metal member contacting the second end of the first monolithic metal member through the first shallow opening.

23. The method of claim 22, wherein patterning the second metal layer further forms a third interconnecting monolithic metal member parallel to the first interconnecting monolithic metal member, the third interconnecting monolithic metal member contacting the first end of the second monolithic metal member through the second deep opening.

24. The method of claim 18, wherein depositing the first metal layer comprises depositing an aluminum layer, and wherein depositing the second metal layer comprises depositing a gold layer.

25. The method of claim 18, each of the first and the second monolithic metal members having a first arm and a second arm in the form of an L-shape, wherein a thickness of the first arm is greater than a thickness of the second arm, wherein the thickness of the first and the second arms are measured along the first direction.

26. The method of claim 18, wherein the material of the dielectric layer has a coefficient of thermal conductivity between 1.04 W/mK and 1.25 W/mK.

\* \* \* \* \*